US012754252B2

(12) United States Patent
Altaf et al.

(10) Patent No.: US 12,754,252 B2
(45) Date of Patent: Oct. 6, 2026

(54) METHOD AND SYSTEM FOR RECONFIGURING AN ELECTRICAL ENERGY STORAGE SYSTEM COMPRISING MULTIPLE ELECTRICAL ENERGY STORAGE PACKS

(71) Applicant: VOLVO TRUCK CORPORATION, Gothenburg (SE)

(72) Inventors: Faisal Altaf, Västra Frölunda (SE); Anton Klintberg, Torslanda (SE); Björn Fridholm, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 519 days.

(21) Appl. No.: 18/338,823

(22) Filed: Jun. 21, 2023

(65) Prior Publication Data

US 2024/0133969 A1 Apr. 25, 2024

(30) Foreign Application Priority Data

Jun. 30, 2022 (EP) .................................... 22182307

(51) Int. Cl.
*B60L 58/16* (2019.01)
*G01R 31/382* (2019.01)
(Continued)

(52) U.S. Cl.
CPC ......... *G01R 31/392* (2019.01); *G01R 31/382* (2019.01); *G01R 31/396* (2019.01); *H01M 10/482* (2013.01); *H01M 2220/20* (2013.01)

(58) Field of Classification Search
CPC .. G01R 31/392; G01R 31/382; G01R 31/396; H01M 10/482; H01M 2220/20;
(Continued)

(56) References Cited

U.S. PATENT DOCUMENTS

2005/0040789 A1 2/2005 Salasoo et al.
2012/0068715 A1 3/2012 Martaeng
(Continued)

FOREIGN PATENT DOCUMENTS

EP 2410346 A1 * 1/2012 ........... G01R 31/389
EP 4002547 A1 5/2022
(Continued)

OTHER PUBLICATIONS

Final Office Action dated Apr. 3, 2026 in corresponding U.S. Appl. No. 18/338,839, 46 pages.
(Continued)

*Primary Examiner* — Catherine T. Rastovski
*Assistant Examiner* — Emma Alexander
(74) *Attorney, Agent, or Firm* — Jeffri A. Kaminski; Venable LLP

(57) ABSTRACT

A method includes determining a state of health of each of the electrical energy storage packs; detecting at least one malfunctioning electrical energy storage pack of the electrical energy storage system; determining an uncertainty measure for each of the determined state of health's; concluding to replace the electrical energy storage packs having state of health lower than a minimum state of health, and electrical energy storage packs that are concluded to be malfunctioning. The determined state of health's and the corresponding uncertainties for maintained electrical energy storage packs are evaluated. A set of replacement electrical energy storage packs are evaluated to find a combination of maintained electrical energy storage packs and replacement electrical energy storage packs that fulfil energy and power requirements for the vehicle taking the uncertainties in state of health into account.

14 Claims, 6 Drawing Sheets

(51) Int. Cl.

*G01R 31/392* (2019.01)
*G01R 31/396* (2019.01)
*H01M 10/48* (2006.01)

(58) Field of Classification Search

CPC .......... B60L 53/80; B60L 58/18; B60L 58/21; B60L 58/22; B60L 58/16

See application file for complete search history.

(56) References Cited

U.S. PATENT DOCUMENTS

| | | | |
|---|---|---|---|
| 2013/0030739 | A1 | 1/2013 | Takahashi et al. |
| 2015/0239365 | A1 | 8/2015 | Hyde et al. |
| 2017/0067967 | A1 | 3/2017 | Bryngelsson et al. |
| 2017/0240064 | A1 | 8/2017 | Lee |
| 2018/0010919 | A1 | 1/2018 | Huang et al. |
| 2019/0310319 | A1 | 10/2019 | Legnedahl et al. |
| 2021/0021137 | A1 | 1/2021 | Zeng et al. |
| 2021/0090153 | A1 | 3/2021 | Murai et al. |
| 2021/0339653 | A1 | 11/2021 | Yamamoto et al. |
| 2022/0059886 | A1 | 2/2022 | Gréber |
| 2022/0063444 | A1 | 3/2022 | Altaf et al. |
| 2022/0099745 | A1 | 3/2022 | Kroener et al. |
| 2022/0146583 | A1 | 5/2022 | Kim et al. |

FOREIGN PATENT DOCUMENTS

| | | | |
|---|---|---|---|
| JP | 2014011060 | A | 1/2014 |
| WO | 2013080211 | A1 | 6/2013 |
| WO | 2018104965 | A1 | 6/2018 |
| WO | 2020243466 | A1 | 12/2020 |
| WO | 2021001013 | A1 | 1/2021 |

OTHER PUBLICATIONS

European Communication pursuant to Article 94(3) EPC dated Jan. 5, 2026 in corresponding European Patent Application No. 22182307.3, 11 pages.
Extended European Search Report in corresponding European Application No. 22182307.3 dated Jan. 5, 2023 (12 pages).
Extended European Search Report in corresponding European Application No. 22182283.6 dated Dec. 9, 2022 (12 pages).
Non Final Office Action dated Oct. 27, 2025 in corresponding U.S. Appl. No. 18/338,839, 33 pages.

* cited by examiner

METHOD AND SYSTEM FOR RECONFIGURING AN ELECTRICAL ENERGY STORAGE SYSTEM COMPRISING MULTIPLE ELECTRICAL ENERGY STORAGE PACKS

TECHNICAL FIELD

The present disclosure relates to a method for reconfiguring electrical energy storage packs of an electrical energy storage system of a vehicle. The present disclosure also relates to a system, a control unit, and computer program. Although the method and system will be described in relation to a vehicle in the form of a truck, the method and system can also be efficiently incorporated in other vehicle types such as busses, light-weight trucks, passenger cars, construction equipment, marine vessels, and industrial equipment, as long as they are at least partly electrically propelled.

BACKGROUND

Electrical energy storage packs are becoming a more common source of energy for providing propulsion power to vehicles. Such electrical energy storage packs are rechargeable electrical energy storage packs and consist of several electrical energy storage cells that may be connected in series and/or in parallel forming a complete electrical energy storage system for the vehicle.

However, electrical energy storage packs age and will with time need replacement. Different generation/types of electrical energy storage packs may exhibit different electro-thermal and ageing characteristics and may therefore show significantly different dynamic behaviour. The maximum power ability of battery pack is heavily influenced by internal resistance imbalance and internal voltage imbalance as well as the resistance and OCV as such. A perfectly homogenous multi-battery system is provided when zero parametric and power ability imbalances between battery packs is achieved and results in robust and safe operation due to equal sharing of power between battery packs.

However, such homogeneous multi-battery system is not likely due to intrinsic parametric variations between new cells, non-uniform operating conditions, differences in connection cable lengths, and ageing dispersion between packs. In particular, the imbalances are inevitable after replacement of a broken battery with a new one, which might be based on even new generation of cells. This results in a so-called heterogeneous multi-battery system.

The replacement decision is often based on evaluating a state of health (SOH) imbalance between battery packs. However, SOH is an estimated quantity, and its accuracy is difficult to estimate. This may lead to unnecessary or even incorrect battery packs replacements during service leading to a highly unbalanced multi-battery system.

Further, it may also be important to understand the impact of a replacement on the vehicle performance in terms of for example range and power.

Accordingly, it is desirable to improve the methods and systems for performing accurate battery pack replacements.

SUMMARY

An object of the invention is to provide an improved method and system for reconfiguring electrical energy storage packs of an electrical energy storage system of a vehicle.

According to the first aspect of the invention, there is provided a method for reconfiguring electrical energy storage packs of an electrical energy storage system of a vehicle, the method comprising: determining a state of health of each of the electrical energy storage packs of the vehicle; detecting at least one malfunctioning electrical energy storage pack of the battery; determining an uncertainty measure for each of the determined state of health's; concluding to replace the electrical energy storage packs having state of health lower than a minimum state of health, and electrical energy storage packs that are concluded to be malfunctioning, evaluating the determined state of health's and the corresponding uncertainties for maintained electrical energy storage packs and a set of replacement electrical energy storage packs to find a combination of maintained electrical energy storage packs and replacement electrical energy storage packs that fulfil energy and power requirements for the vehicle taking the uncertainties in state of health into account; determining a new configuration of the electrical energy storage system including the combination of maintained electrical energy storage packs and replacement electrical energy storage packs, provide a signal indicating an arrangement of the electrical energy storage packs according to the new configuration, once electrical energy storage pack replacement is performed, determining a load sharing factor indicative of a load distribution between the electrical energy storage packs of the new configuration, and if the load sharing factor fulfils a predetermined condition, performing a reconfiguration of the electrical energy storage pack to more equally distribute the load across the electrical energy storage packs.

By the provision of including the uncertainties of the determined state of health, instead of just using their nominal values, the uncertainties are also included to provide a margin to reduce the risk of a pack replacement leading to power or energy that is lower than expected in the reconfigured electrical energy storage system.

Determining the load distribution between the electrical energy storage packs after reconfiguration may include to estimate energy and power de-rating after reconfiguration using a multi-battery system dynamic model. Using the multi-battery system dynamic model allows for analysing the impact on energy and power capability of a new electrical energy storage system configuration after a certain replacement decision where a combination of replacement electrical energy storage packs and maintained electrical energy storage packs are included. A multi-battery system dynamic model is configured to model power sharing/split dynamics between different electrical energy storage packs in the electrical energy storage system. Since energy and power of multi-battery electrical energy storage systems depends on the power sharing/split dynamics, it is advantageous to accurately model the power sharing/split dynamics for estimating total energy and power of the multi-battery electrical energy storage system.

Multi-battery system dynamic models may be realized in different ways, but can take as input, the type of battery packs in terms of cell chemistry, and their present state of health, and provides an output of how the power is split or shared between battery packs, and the total power and energy that can be obtained therefrom. A battery pack may be generally modelled as an equivalent circuit of electrical components such as a resistor in series with a parallel connected capacitor and second resistor. Several such parallel circuits may be connected in series. Several such battery packs may be connected in parallel to simulate a multi-battery system. A dynamic model of a multi-battery system can be developed using various approaches including equivalent circuit, electro-chemical, empirical, semi-empirical etc. The model can be mathematically represented in the form of differential equations, transfer functions, state-space form etc. The model is used for electro-thermal simulation of any multi-battery system, providing: prediction of current/power split between battery packs in electrical energy storage systems i.e., prediction of current flow through each battery pack for a given total energy storage system current, prediction of temperature evolution for each pack under given coolant flow and predicted current flow, prediction of SoC evolution for each battery pack under predicted current flow, in-rush current prediction through each battery pack under connection on the fly. Such a multi-battery system dynamic model may be configurable for any number of batteries along with individual setting of ageing level, SoQ and SoR, for each battery pack. In addition, cable connection resistance can be specified for each battery pack. The model may also be particularly useful for estimating overall SoP and SoE for heterogeneous ESS. As a reference, the disclosures EP2019/086833, EP2019/086835, EP2020/066874, and EP2020/066919, incorporated by reference, describes variations of such a multi-battery system dynamic model.

Determining the load distribution between the electrical energy storage packs may further be based on other types of models or even look-up tables where given combinations of electrical energy storage packs are related to minimum state of health levels and load distribution parameters. Further types of models or estimations are also envisaged.

A minimum state of health can be determined with respect to minimum level of performance required in terms of power and range. In other words, the minimum state of health is a threshold below which power and/or range requirements for the vehicle can no longer be met. The power and/or range requirements may be related to mission requirements determined as per usage pattern classification. Further, a minimum state of health may also be determined with respect to a required service lifetime of the electrical energy storage system. For example, the minimum state of health may be set so that a replacement with a battery pack of sufficient state of health such that the new electrical energy storage system after replacement can deliver a required energy and power at least for a remaining predetermined time period. A remaining predetermined time period can in some example implementations be a remaining warranty or contractual duration.

State of health may be defined as the loss in capacity relative to a capacity at the beginning of life of the battery, or the internal resistance increase of the battery relative the internal resistance at the beginning of life of the battery. Further, state of health may equally be defined of loss in range, loss in peak acceleration capability, efficiency loss etc.

State of health parameters that may be measured for determining a state of health may include at least a state of capacity and a state of resistance of the battery. These state of health parameters are well established and advantageously relatively straight-forward to measure and are typically available from automotive battery management systems.

Reconfiguration is herein understood to mean a suggested or performed replacement of one or more electrical energy storage packs in the electrical energy storage system to achieve more balanced load sharing factors among all electrical energy storage packs in the electrical energy storage system. It further includes determining whether only a broken or failed electrical energy storage pack should be replaced or if further electrical energy storage pack should also be replaced in order to meet the overall performance requirements. Further model-based estimation of expected power and energy de-rating after replacement may be performed. For this, a multi-battery electrical energy storage model is used which allows for determining in advance how power sharing will happen between electrical energy storage packs after replacement.

Still further, reconfiguration considers where each electrical energy storage pack should be physically placed in a vehicle. This may play some important role due to different connection cable lengths. For example, difference in cable lengths may be utilized to create load sharing balance between electrical energy storage pack. For example, a more powerful electrical energy storage pack may be placed far from a load so that the electrical energy storage pack sees more resistance the thereby tune the power sharing balance between electrical energy storage pack. Similarly, an electrical energy storage pack may also be placed closer to the load so that it takes higher power share according to a higher power capability of the electrical energy storage pack and the weakest electrical energy storage pack is placed at the far end so that it does not take a too high power share.

State of charge, SOC, which is mentioned herein is the present level of charge in the electrical energy storage compared to its full capacity and may be given as a percentage value.

The propulsion electrical energy storage should be interpreted as providing propulsion power to the vehicle. Thus, the vehicle may be an electrical, hybrid, or plug-in hybrid vehicle comprising an electrical engine, wherein the electrical energy storage provides power to the electrical engine for providing propulsion for the electrical, hybrid, or plug-in hybrid vehicle. The electrical energy storage may be Li-ion electrical energy storage comprising multiple cells arranged in series and in parallel as is known in the art.

An electrical energy storage may herein be considered a battery.

The methods described herein are preferably computer-implemented.

As an alternative to using the load sharing factor it is conceivable to compare total power ability, i.e., state of power, and total energy storage capability, i.e., state of energy of the electrical energy storage system with power and energy requirements for a given vehicle application. These requirements may be derived based on the first step of vehicle usage classification as described above. If the state of power and the state of energy are greater than the required power and energy levels then the new configuration of the electrical energy storage packs can be considered correct.

In some embodiments, finding a combination of maintained electrical energy storage packs and replacement electrical energy storage packs may comprise inserting the determined state of health's and corresponding uncertainties of the electrical energy storage packs in a decision matrix to determine further electrical energy storage packs to replace.

A decision matrix can represented in various ways. For example, the decision matrix may be a decision tree or look-up table which is pre-computed based on a priori information regarding type of vehicle application and existing energy storage system size, i.e., number of battery packs inside energy storage system. This decision matrix can be precomputed for a set of applications. For any given application, it takes as input state of health of each maintained battery pack and then one can look-up state of health of replacement packs needed to meet energy and power requirement for a given application. The decision matrix may also provide various alternatives depending on number of replacement packs to meet energy and power requirements.

According to an example embodiment, wherein that the load sharing factor fulfils a predetermined condition may include that the load sharing factor is within a predetermined interval, wherein when the load sharing factor is concluded to be within the predetermined interval, concluding that the electrical energy storage pack replacement is completed.

When the load sharing factor is concluded to fall outside the predetermined threshold, repeat the step of evaluating with a further combination of replacement electrical energy storage packs and maintained electrical energy storage packs, and the step of determining a load sharing factor and performing a reconfiguration.

The load sharing factor provides an accurate measure for concluding whether a new configuration of electrical energy storage packs provides a well-balanced electrical energy storage system. Further, it provides for a confirmation that the combination of replacement electrical energy storage packs and maintained electrical energy storage packs was indeed acceptable in terms of electrical energy storage balance. As discussed above, as an alternative to using the load sharing factor it is conceivable to compare total power ability, i.e., state of power, and total energy storage capability, i.e., state of energy of the electrical energy storage system with power and energy requirements for a given vehicle application.

Generally, a load sharing factor that is too low or too high compared to its power ability factor, i.e. not in the predetermined interval is indicative of unacceptable large imbalance between electrical energy storage packs and thus potentially much lower power performance of the electrical energy storage system due to constraints posed by "weakest-link-in-chain", stated differently, due constraints posed by the electrical energy storage pack with the lowest state of health. Further, it provides for a confirmation that the combination of replacement electrical energy storage packs and maintained electrical energy storage packs was indeed acceptable in terms of electrical energy storage balance. As discussed above, as an alternative to using the load sharing factor it is conceivable to compare total power ability, i.e., state of power, and total energy storage capability, i.e., state of energy of the electrical energy storage system with power and energy requirements for a given vehicle application.

In one example embodiment, the load sharing factor may be a ratio between a measured discharge/charge current from an electrical energy storage pack and the average discharge/charge current for all electrical energy storage packs of the battery when exposed to a load. Hereby, a relatively straight forward way for evaluating how well the load is distributed across the electrical energy storage packs. Preferably, the load sharing factors for all the electrical energy storage packs are equal or at least substantially equal within some margin.

In one example embodiment, for determining the that load sharing factor fulfils a predetermined condition, the load sharing factor is compared to a power ability factor given by a ratio between maximum discharge/charge current from an electrical energy storage pack and the maximum average discharge/charge current for all electrical energy storage packs of the battery.

In one example embodiment, the load sharing factor should not deviate by more than a threshold from the power ability factor to indicate an allowable electrical energy storage pack configuration.

The uncertainty for each of the determined state of health's may be determined from uncertainties in electrical measurements performed for measuring an electrical energy storage pack parameter used for estimating the state of health.

Some examples of the source of SoH uncertainty are provided in this non-exhaustive list of input parameters: error/uncertainty in electric current measurement, error/uncertainty in voltage measurement, error/uncertainty in temperature measurement, error/uncertainty in SoC measurement, error/uncertainty in OCV characteristics, error/uncertainty in battery capacity, error/uncertainty in battery impedance parameters such as internal resistances and capacitances.

The uncertainties in the above input parameters are propagated through state of power (SoP) and state of energy (SoE) for each battery pack to estimate overall uncertainty in output value of SoP and SoE for each battery pack under some standard/reference operating conditions.

The uncertainties related to the SoP and/or SoE are generally known and may be given in terms of a tolerance range or confidence interval around mean value. The tolerance range or confidence intervals can be computed by analysing statistical properties of input errors, for example gaussian or non-gaussian characteristics of errors in current, voltages, temperatures, and other battery parameters as provided in the list of input parameters, and then propagating these errors through an estimation model.

According to an embodiment, the method may comprise classifying a vehicle usage type using vehicle driving pattern data of the vehicle as input data; and determining the energy and power requirements according to the classified vehicle usage type.

By the provision of the classifying the vehicle usage based on vehicle driving pattern data for the specific vehicle a more accurate use of state of health as indicator for replacement is obtained. More specifically, the minimum state of health that is considered acceptable is based on the usage type or profile or the vehicle itself. Thus, by evaluating logged vehicle data to first decide the driver style, driver aggressiveness, vehicle application, or the most common drive pattern of the vehicle, replacement decisions may be taken, and electrical energy storage pack configurations may be determined, based on more accurate information.

The vehicle drive pattern data is historical logged vehicle data regarding actual usage or driving pattern and/or data provided by a user or client regarding the vehicle's intended use. The vehicle drive pattern data is used as input to a classification algorithm to perform classification of the vehicle usage pattern. For example, vehicle usage pattern can be classified into "benign", "moderate, or "aggressive". Other types of classifications are also conceivable such as classification according to performance requirements to complete a certain mission or set of missions for the vehicle. Example performance requirements include peak acceleration, average acceleration, top speed, range, uphill capability, downhill retardation braking capability, charging time capability, over-taking capability, total cargo weight carrying capability etc. In some implementations the classification can also be made according to vehicle type, e.g., construction truck, city distribution truck, reuse collection truck, flat road truck, hilly truck etc. As an example, using the logged vehicle data, the usage pattern is related to a "high/medium/low" peak acceleration, or any one of the other performance requirements.

Preferably, the method described herein is automated based on logged vehicle data and a multi-battery model.

Thus, the decision to replace battery packs is autonomously made by an application running on-board the vehicle or as a cloud-based application.

The classification is preferably made on a relative scale in a fleet of vehicles. Thresholds or intervals in each performance related parameters or requirement and map them towards a certain type of vehicle usage or more generally a label. For example, if acceleration is between 0 and x1 then vehicle usage type is benign, if between x1 and x2 then vehicle usage type is moderate, and if above x2 then vehicle usage type is aggressive. However, other ways of performing classification and mapping are also envisaged.

Vehicle drive pattern data may be historical driving data as well as data provided by a customer or user for any new vehicle mission requirements.

A minimum state of health can be determined with respect to minimum level of performance required in terms of power and range. In other words, the minimum state of health is a threshold below which power and/or range requirements for the vehicle can no longer be met. The power and/or range requirements may be related to mission requirements determined as per usage pattern classification. Further, a minimum state of health may also be determined with respect to a required service lifetime of the electrical energy storage system. For example, the minimum state of health may be set so that a replacement with a battery pack of sufficient state of health such that the new electrical energy storage system after replacement can deliver a required energy and power at least for a remaining predetermined time period.

According to an embodiment, the method may comprise retrieving data indicating a set of available replacement electrical energy storage packs, their state of health's and uncertainties, and using the data in the evaluation step. The retrieved data is state of health's and uncertainties thereof for electrical energy storage packs available in a storage.

According to an embodiment, the step of evaluating may comprise modelling the power and energy available for the combination of maintained electrical energy storage packs and replacement electrical energy storage packs using a multi-battery system dynamic model, and modelling the combination of maintained electrical energy storage packs and replacement electrical energy storage packs to determine load distribution between electrical energy storage packs after reconfiguration using a multi-battery system dynamic model.

After the step of concluding a replacement, the model-based estimation provides for determining, in advance, how power sharing will occur between electrical energy storage packs after replacement of one of more electrical energy storage packs.

In embodiments, each vehicle usage type may be based on modelled power and energy requirements for the associated vehicle usage type. Thus, by logging vehicle drive pattern data, and input this data to a model of data related to power and energy requirements the vehicle usage type may be determined or classified. Various types of models are envisaged, and a few examples are mentioned herein. For example, the model may be based on histograms to capture distribution of average or peak power and total energy consumption per trip. In addition, power histogram can also be represented in correlation with SoC i.e., how much power is consumed at different SoC levels and how frequently that power level.

Further, it is conceivable to use models based on machine learning methods. For example, a model such as a neural network, logistic regression, support vector machine, etc may be trained by providing electrical energy storage system usage inputs including power usage, energy usage, etc, and providing output labels regarding "classes of loads" including herein discussed benign, moderate, and aggressive, etc. The trained models will then be configured to classify any given usage in terms of load types or vehicle type.

Since each vehicle usage type may be based on modelled power and energy requirements for the associated vehicle usage type, the step of reconfiguring may further comprise performing reconfiguration in such a way that vehicle performance requirements are met.

According to an example embodiment, the method may comprise acquiring logged vehicle driving pattern data including charging session data from an on-board memory storage device or from a remote server through cloud connectivity. Although the vehicle drive pattern data is typically obtained or logged by the on-board control unit and memory, the vehicle drive pattern data is transmitted to the cloud on a regular basis to reduce the vehicle on-board memory requirements. The vehicle usage type is classified also based on the charging session data indicating amount of energy charged and frequency of charging sessions.

According to an example embodiment, wherein the drive pattern data may include at least one of: average current and/or power flow through each of the electrical energy storage packs, peak power points for the electrical energy storage packs, duration of the power peaks, a statistical distribution of power, average and peak charging power, average and maximum energy consumed, operating SoC window etc. for a specific vehicle usage type or for a typical driving trip.

According to an example embodiment, the method may comprise continuously monitoring the state of health of the electrical energy storage packs to evaluate whether a replacement is needed, and if a replacement of an electrical energy storage pack is conclusive, provide a signal indicative thereof to a user. This may further be achieved by comparing available energy and power ability with the required energy and power respectively.

Preferably, the method is performed as an on-board application of the vehicle. However, it is envisaged that the method may be performed as a cloud-based service.

Preferably, the method described herein is automated based on logged vehicle data and a multi-battery model. Thus, the decision to replace battery packs is autonomously made by an application running on-board the vehicle or as a cloud-based application.

According to a second aspect of the invention, the object is achieved by a system according to claim 11.

According to the second aspect of the invention, there is provided a system for reconfiguring electrical energy storage packs of an electrical energy storage system of a vehicle, comprising: sensors for collecting driving pattern data indicative of the use pattern of the vehicle and for collecting electrical energy storage sensor data, and a control unit configured to: determine a state of health of each of the electrical energy storage packs of the vehicle from the sensor data; detect at least one malfunctioning electrical energy storage pack of the battery by evaluating the sensor data; determine an uncertainty measure for each of the determined state of health's based on uncertainties in the sensor data; conclude to replace the electrical energy storage packs having state of health lower than a minimum state of health, and electrical energy storage packs that are concluded to be malfunctioning, evaluate the determined state of health's and the corresponding uncertainties for maintained electrical energy storage packs and a set of replacement electrical energy storage packs to find a combination of maintained electrical energy storage packs and replacement electrical energy storage packs that fulfil energy and power requirements for the vehicle taking the uncertainties in state of health into account; determine a new configuration of the electrical energy storage system including the combination of maintained electrical energy storage packs and replacement electrical energy storage packs, provide a signal indicating an arrangement of the electrical energy storage packs according to the new configuration, once electrical energy storage pack replacement is performed, determine a load sharing factor indicative of a load distribution between the electrical energy storage packs of the new configuration, and if the load sharing factor fulfils a predetermined condition, perform a reconfiguration of the electrical energy storage pack to more equally distribute the load across the electrical energy storage packs and provide a signal indicative of an updated arrangement of electrical energy storage packs.

Effects and features of the second aspect of the invention are largely analogous to those described above in connection with the first aspect.

According to a third aspect of the invention, there is provided a vehicle comprising the system according to the second aspect.

According to a fourth aspect of the invention, there is provided a computer program comprising program code means for performing the steps the first aspect when the program is run on a computer.

According to a fifth aspect of the invention, there is provided a computer readable medium carrying a computer program comprising program code means for performing the steps of the first aspect when the program product is run on a computer.

According to a sixth aspect of the invention, there is provided a control unit for determining an electrical energy storage pack replacement configuration of an electrical energy storage system of a vehicle comprising several electrical energy storage packs, the control unit being configured to perform the steps of the method according to the first aspect.

Effects and features of the third, fourth, fifth, and sixth aspects are largely analogous to those described above in relation to the first aspect.

Further features of, and advantages will become apparent when studying the appended claims and the following description. The skilled person will realize that different features may be combined to create embodiments other than those described in the following, without departing from the scope of the present disclosure.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

Figure 1:
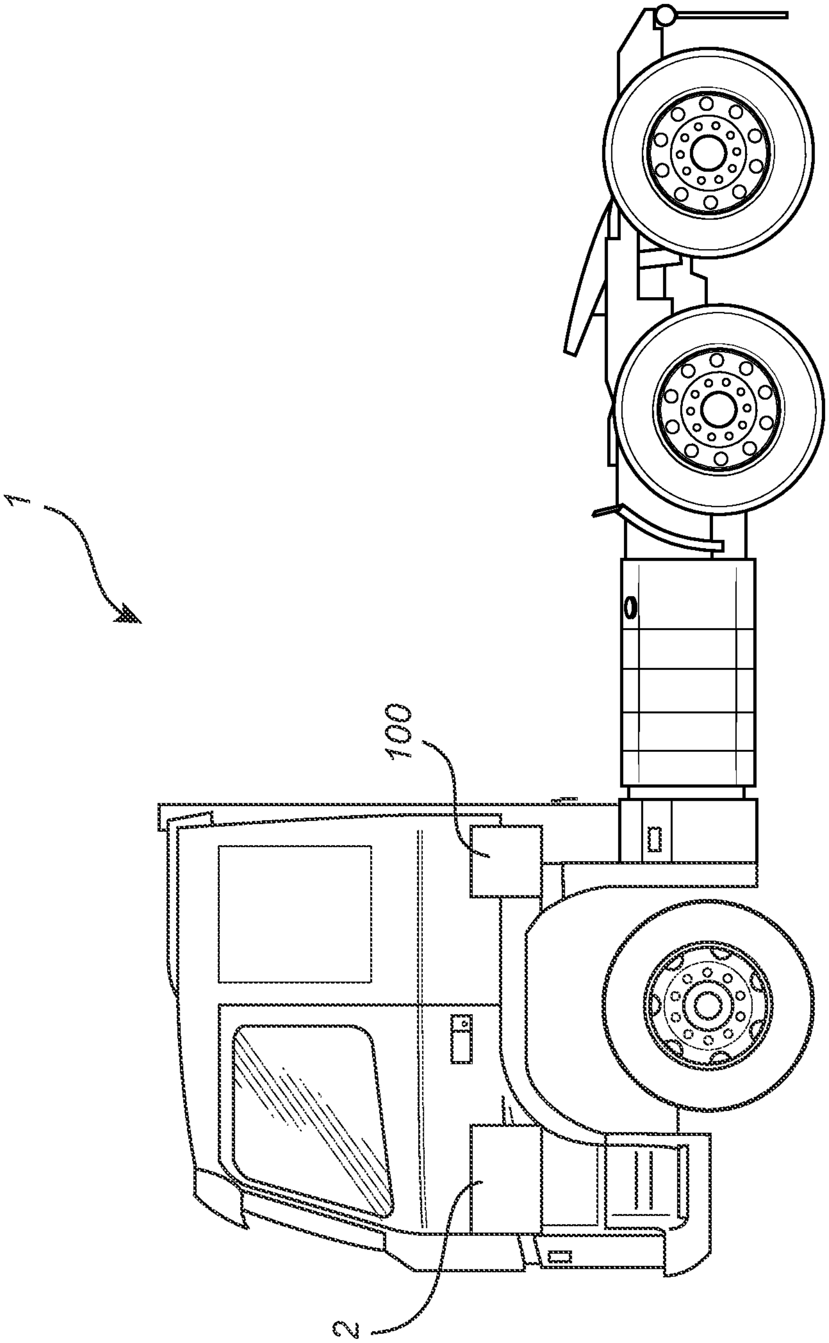
FIG. 1 is a vehicle in the form an electrical truck according to example embodiments of the invention.

The present invention will now be described more fully hereinafter with reference to the accompanying drawings, in which exemplary embodiments of the invention are shown. The invention may, however, be embodied in many different forms and should not be construed as limited to the embodiments set forth herein; rather, these embodiments are provided for thoroughness and completeness. The skilled person will recognize that many changes and modifications may be made within the scope of the appended claims.

Like reference character refer to like elements throughout the description.

FIG. 1 illustrates a vehicle in the form of an electrical truck 1 comprising a propulsion electrical energy storage system 2 generally comprising a plurality of series and parallel connected electrical energy storage cells. The propulsion electrical energy storage 2 is arranged to provide power to an electrical engine (not shown) arranged for providing propulsion for the electrical truck 1. The electrical truck 1 further comprises an electrical energy storage managing system 100 which is configured to monitor electrical energy storage cell characteristics such as state of charge (SOC), state of health (SOH), state of power (SOP), state of energy (SOE), state of capacity (SOQ), etc., electrical energy storage voltage, state of resistance (SOR) i.e., internal impedance, and optionally temperature of the electrical energy storage cells. The propulsion electrical energy storage 2 may be a Li-ion electrical energy storage comprising multiple cells electrically connected in series and in parallel.

Although the vehicle in FIG. 1 is depicted as a heavy-duty truck, embodiments of the present disclosure may as well be implemented in other types of vehicles, such as in busses, light-weight trucks, passenger cars, construction equipment, industrial applications, and marine applications including e.g., vessels or ships.

Figure 2A:
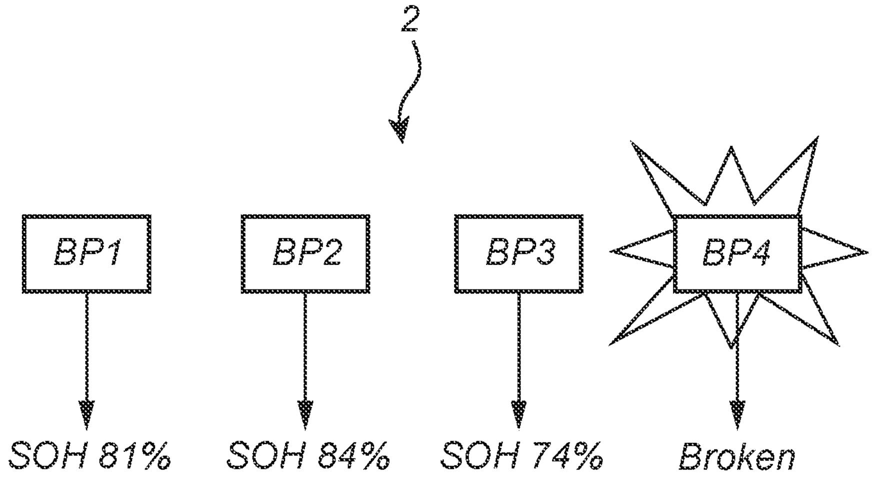
FIG. 2A is an example set of electrical energy storage packs according to example embodiments of the invention.

FIG. 2A conceptually illustrates a plurality of electrical energy storage packs BP1-BP4, e.g., battery packs of an electrical energy storage system 2. Each of the battery packs BP1-BP4 comprises a plurality of battery cells. Aged battery packs typically have higher internal resistance, and hence the lower maximum power ability and capacity, than a new or less aged electrical energy storage packs based on the same cell chemistry. In FIG. 2A, battery pack BP2 can be assumed to have aged less than the battery packs BP1 and BP2 having lower state of health, SOH. Further, battery pack BP4 is here conceptually illustrated as being malfunctioning in some way and is required to be replaced.

Figure 2B:
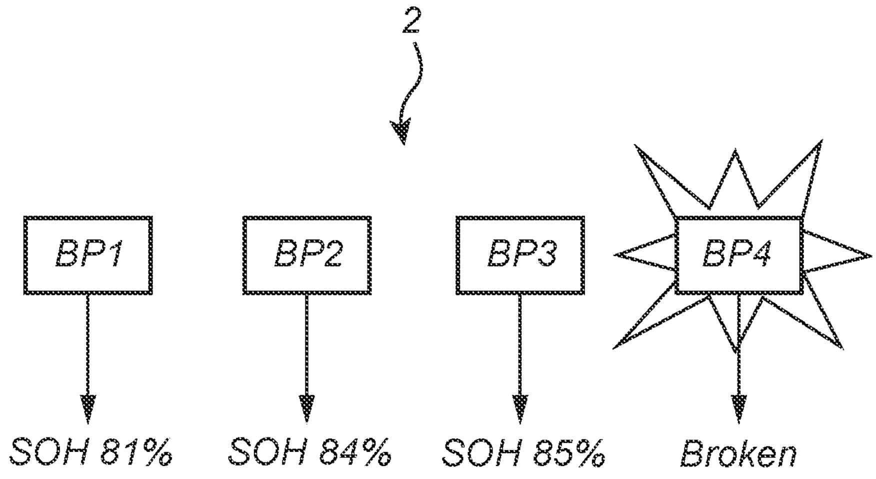
FIG. 2B is an example set of electrical energy storage packs according to example embodiments of the invention.

It can be reasonably assumed that a decrease in power ability and capacity is substantially proportional to an increase in internal resistance, which occurs as a battery pack ages, whereby a power split between battery packs will be according to their power abilities i.e., the old battery pack, BP3, will provide lower power and the less aged battery pack BP2 will provide higher power according to their maximum power abilities. However, the assumption may not always be accurate, which may lead to power flow through an old battery pack, BP3 that is higher than its maximum power ability. This is particularly true for mixed generation multi-battery systems where old and new battery packs are based on slightly different cells chemistries. In addition, other imbalances including operating conditions, cable lengths etc. also have an impact on power distribution across the battery packs. Under these heterogeneities, there is instead unlikely that power distribution will be according to the individual power abilities of the battery packs. For example, a more aged battery pack BP3 may reach its power limit first, leading to under-utilization of a newer battery pack BP2. In short, the total power of the electrical energy storage system 200 may get severely limited by the weakest link. In cases where the remaining battery packs BP1-BP3, that are not malfunctioning, have a sufficiently high state of health, e.g., higher than 80%, as indicated in FIG. 2B, then it may not be necessary to replace the battery packs BP1-BP3. However, in a situation where one or more of the functioning battery packs have a relatively low state of health, as the battery pack BP3 in FIG. 2A having state of health below 80%, then replacement of battery pack BP3 may also be concluded to be necessary in order to fulfil vehicle performance requirements. The embodiments presented herein addresses how to configure a replacement of battery packs in such a way to avoid or alleviate the above issues. Now, turning to specific embodiments described with reference to the drawings.

State of health is typically estimated based on capacity loss and/or impedance growth. The end-of-life (EoL) of a battery can be defined according to a certain minimum threshold on remaining capacity or a maximum threshold on impedance increase. For example, when a battery loses 30% of its capacity (i.e., 70% remaining capacity) or gains 50% resistance (i.e., 150% internal impedance) then this can be set as end of life for that battery. These thresholds are dependent on battery chemistry and vehicle application as per performance requirements. Based on this, the value of State of health can be represented in percentage in a relative scale or in an absolute scale.

In a relative scale, state of health is represented on a scale of 0 to 100% relative to the end-of-life threshold where 100% means battery is new and 0% means battery has reached its end-of-life (EoL).

In an absolute scale state of health is represented in percentage according to the actual percentage loss of capacity or percentage increase in impedance. For example, SoH=80% when the capacity loss is 20%.

Note that typically maximum 20 to 30% loss in capacity or 50 to 70% increase in impedance is considered in EV applications.

In the drawings, the percentages in the figures should be interpreted appropriately based on one of the relative scale and absolute scale. If a relative scale is used then 0% may be end of life, and if the absolute scale is used then, for example, a percentage in the range of 70%-80% may be considered as end of life.

Figure 3:
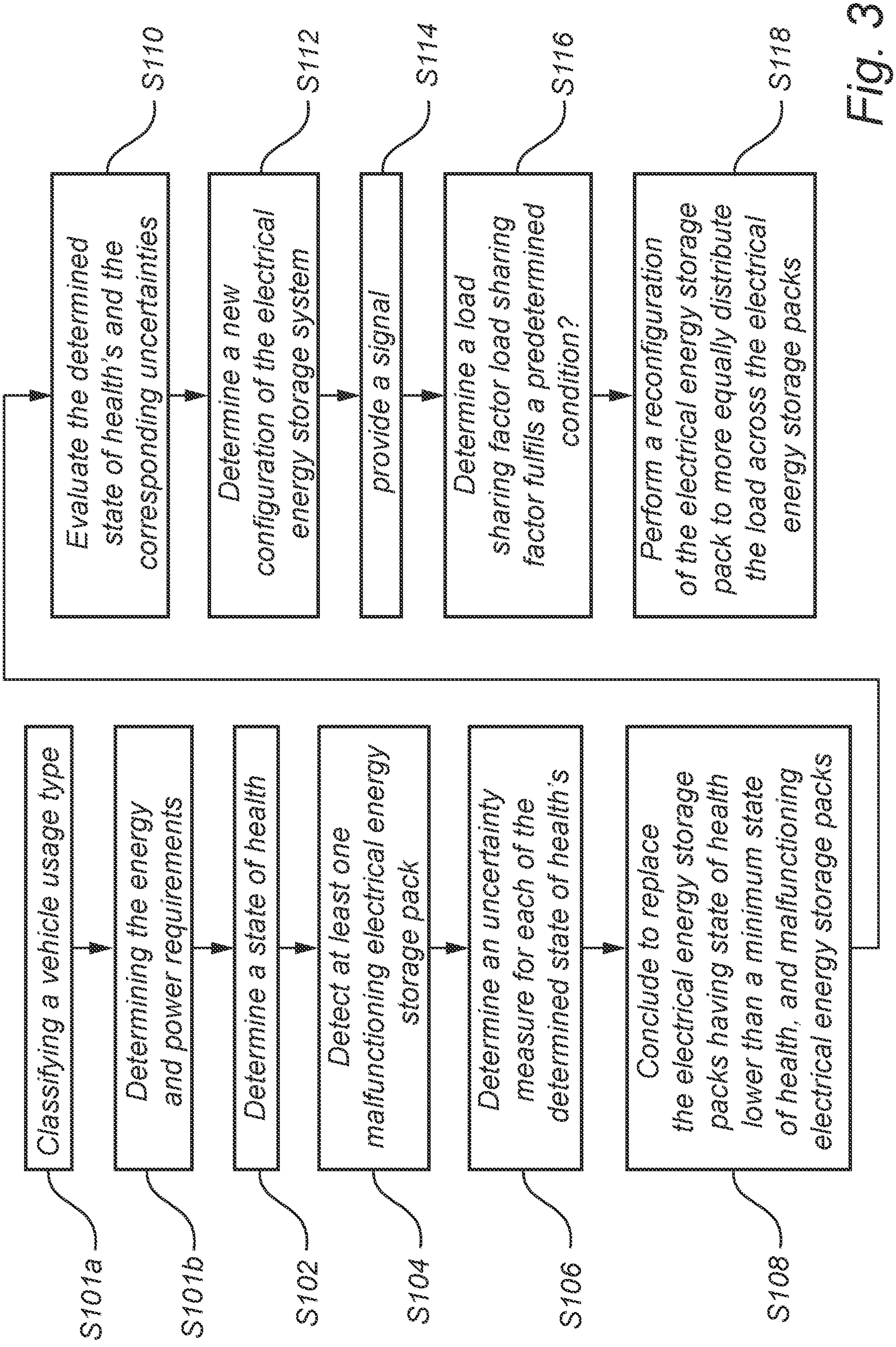
FIG. 3 is a flow-chart of method steps according to example embodiments of the invention.
Figure 4:
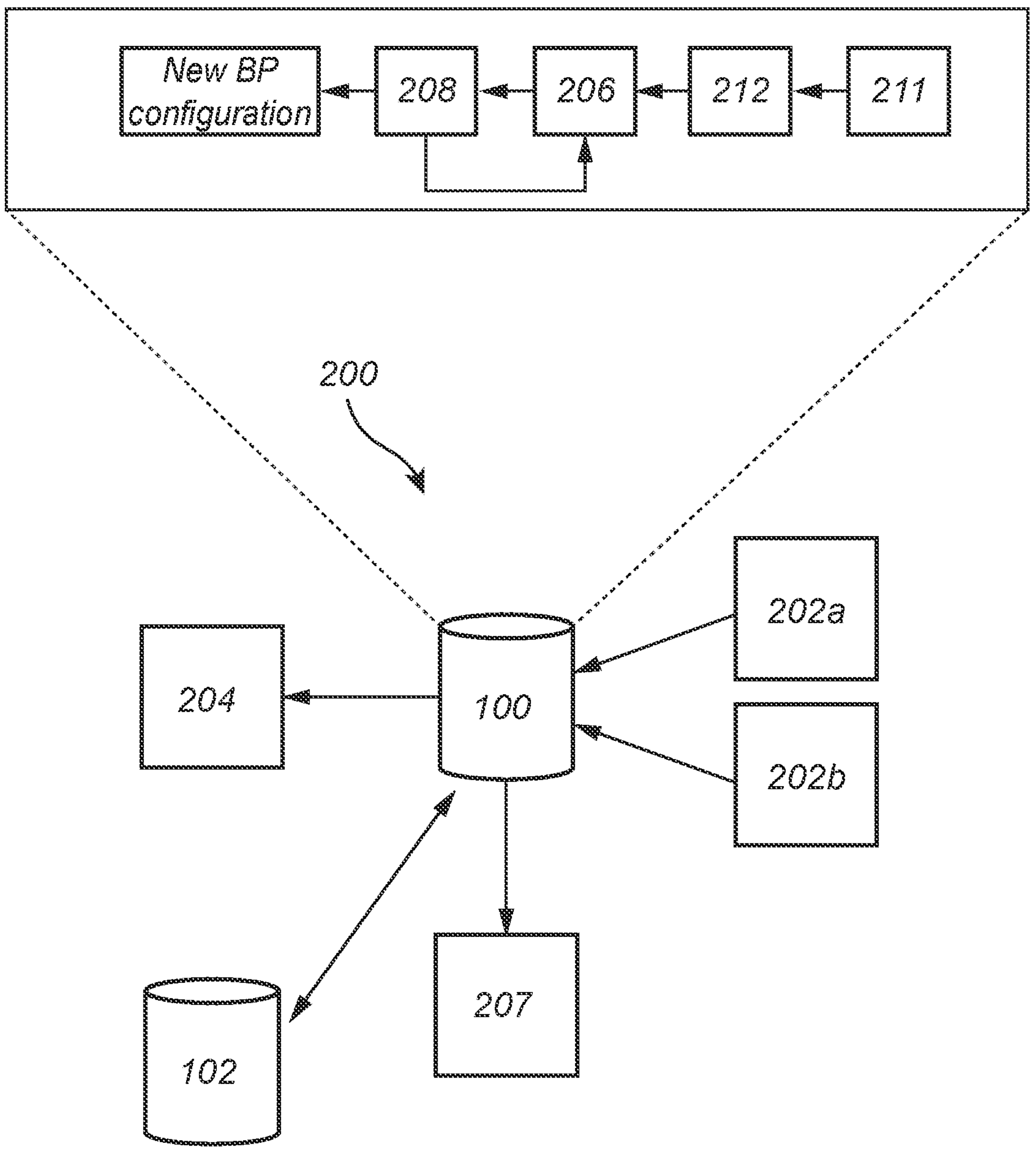
FIG. 4 is a block diagram of a system according to example embodiments of the invention.

FIG. 3 is a flow-chart of method steps and FIG. 4 is a block diagram of a system 200 of embodiments of the present invention.

The system comprises a control unit 101, a set of sensors 202*a* and 202*b*, optionally an on-board data storage memory 204, and wireless transmission means for connecting with a remote server 102.

The sensors 202*a* may be configured to collect driving pattern data indicative of the use pattern of the vehicle and sensor 202*b* are configured to collect electrical energy storage sensor data. Here only two sensors are schematically shown but is it generally understood that more than two sensors may be utilized, this means that the sensors 202*a-b* may be considered sensor assemblies comprises multiple sensors.

Drive pattern data may indicate a certain driver style or vehicle usage type. For example, the sensors 202*a* may collect data indicating yaw rates, roll rates, pitch rates, lateral and longitudinal acceleration, speed, and may for example include gyroscopes and accelerometers part of an inertial measurement unit of the vehicle 1.

The sensors 202*b* are configured to collect data indicative of characteristics and parameters of the electrical energy storage system 2. Such sensors 202*b* may be voltage and/or current sensors for detecting a voltage of each battery pack BP1-BP4, or each cell of the battery packs BP1-BP4, or an electrical discharge of charge current of each battery pack BP1-BP4, or each cell of the battery packs BP1-BP4. The sensors 202*b* may also include temperature sensors for measuring a temperature of each battery pack BP1-BP4. Data from the sensors 202*b* may be used for estimating e.g., SOC, SOH, SOP, SOE, SOQ, etc.

In step S102 a state of health of each of the electrical energy storage packs BP1-BP4 of the vehicle 1 is determined. The control unit 101 is configured to determine the state of health's using the sensor data collected from the sensors 202*a-b*.

In step S104 is at least one malfunctioning electrical energy storage pack of the electrical energy storage system 2 detected. In this example embodiment, battery pack BP4 is indicated as malfunctioning. This may be concluded by the control unit 101 by receiving fault codes from the vehicle battery management system, or by detecting out of range data using the sensors 202*b*.

An uncertainty measure for each of the determined state of health's is determined in step S106. The uncertainty measure is based on measurement uncertainties in the sensors 202*b* used for determining the state of health. The control unit 101 may have prior knowledge of the measurement uncertainties for each of the sensors which may be stored in a memory storage 204. Using the predetermined measurement uncertainties, for each of the sensors, the control unit 101 can propagate them through the models used for determining state of health to estimate overall uncertainty in output value of the state of health for each battery pack BP1-BP3.

In step S108, the control unit 101 is configured to conclude to replace the electrical energy storage packs having state of health lower than the minimum state of health, and electrical energy storage packs that are concluded to be malfunctioning. As an example, the battery packs BP3 in FIG. 2A have state of health below a minimum state of health of 80% in an absolute scale, and battery pack BP4 is concluded to be malfunctioning. In other words, the battery packs BP3 and BP4 need to be replaced in order to fulfil a minimum level of performance for the intended usage or specific application for the vehicle 1. Stated otherwise, firstly, it is determined which electrical energy storage packs to replace. In FIG. 2A, the battery pack BP3 has state of health below a predetermined threshold of 80%, and battery pack BP4 is malfunctioning so battery packs BP3 and BP4 are determined to need replacement. In FIG. 2B, the battery packs BP4 is malfunctioning and the remaining battery packs BP1-BP3 have state of health exceeding the predetermined threshold of 80%, so only BP4 is determined to need replacement.

The control unit 101 may use a power and energy requirement model 212 which relates a minimum level of performance required in terms of power, energy and/or range for the vehicle provided its intended use, assignments, or mission, to a minimum state of health of the battery packs BP1-BP4 may be used for finding the minimum state of health. The minimum state of health is a threshold below which power and/or range requirements can no longer be meet.

Subsequently, the control unit 101 is configured to evaluate the determined state of health's and the corresponding uncertainties for maintained electrical energy storage packs, e.g., BP1 and BP2 in FIG. 2A or BP1-BP3 in FIG. 2B, and a set of replacement electrical energy storage packs to find a combination of maintained electrical energy storage packs and replacement electrical energy storage packs that fulfil energy and power requirements for the vehicle taking the uncertainties in state of health into account. The control unit 101 evaluates the upper and lower bounds of the overall state of energy and state of power that can be provided by the electrical energy storage system as provided by the upper and lower limits provided by the uncertainties being propagated through the calculations for estimating state of energy and state of power for concluding whether or not energy and power requirements are fulfilled. This evaluation includes testing different combinations and organisations or distributions of the maintained or remaining battery packs and new or refurbished replacement battery packs. The control unit 101 has access to an inventory of available replacement battery packs and their state of health and uncertainty thereof. Thus, the control unit 101 may retrieve data indicating a set of available replacement electrical energy storage packs, their state of health's and uncertainties, and using the data in the evaluation for fining a viable combination of electrical energy storage packs.

Finding a combination of maintained electrical energy storage packs and replacement electrical energy storage packs comprises inserting the determined state of health's and corresponding uncertainties of the electrical energy storage packs in a decision matrix to determine further electrical energy storage packs to replace.

Figure 2C:
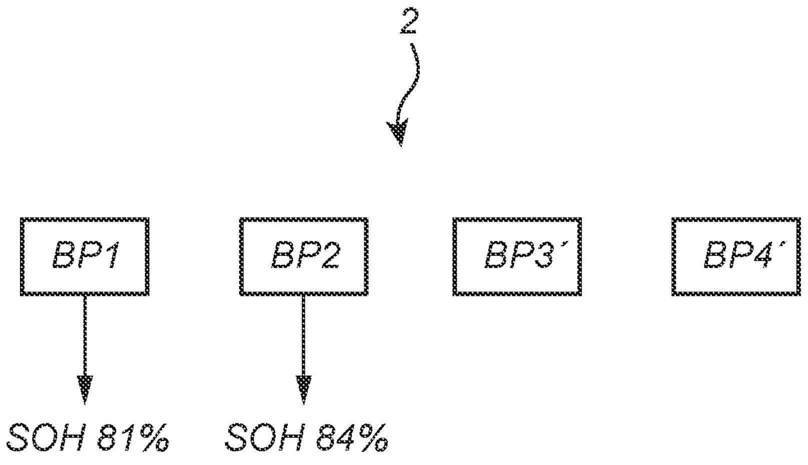
FIG. 2C is an example set of electrical energy storage packs according to example embodiments of the invention.

A new configuration of the electrical energy storage system, conceptually shown in FIG. 2C, including the combination of maintained electrical energy storage packs BP1 and BP2 and replacement electrical energy storage packs BP3' and BP4' is determined in step S112. The new configuration includes which battery packs are included and their placement relative the other battery packs in the overall electrical energy storage system 2 and relative the loads since this affects the resistance seen by the battery pack.

Further, the control unit 101 provides a signal 207 indicating an arrangement of the electrical energy storage packs according to the new configuration in step S114. The signal may be provided to a user interface so that a technician may access the data in the signal.

In some embodiments the step of evaluating comprises modelling the power and energy available for the combination of maintained electrical energy storage packs and replacement electrical energy storage. Further, evaluating comprises modelling the combination of maintained electrical energy storage packs and replacement electrical energy storage to determine load distribution between electrical energy storage packs after reconfiguration. Thus, firstly the control unit uses a multi battery state of power and state of energy model 206 for determining the available state of power (SOP), and state of energy (SOE), if a given new combination of battery packs is used, provided the uncertainties. This combination of added, new or refurbished electrical energy storage pack and prior, remaining, or maintained electrical energy storage pack is modelled to determine a load distribution between the electrical energy storage packs after reconfiguration using a multi battery dynamic power sharing/split power model 208. This may be iterated until a viable combination of electrical energy storage packs is found. Thus, the control unit 101 is configured to use models of new or recycled battery packs and models the remaining prior battery packs BP1 and BP2 in the shown example in FIG. 2C, to estimate the distribution of the load between the maintained battery packs BP1, BP2, and the replacement battery packs BP3', BP4'. Here, battery packs BP1 and BP2 are prior battery packs that have not been replaced, and battery packs BP3', BP4' are added new, refurbished, or recycled battery packs that have replaced battery packs BP3 and BP4. The models 206 and 208 are preferably multi-battery system dynamic models as discussed herein and disclosed in EP2019/086833, EP2019/086835, EP2020/066874, and EP2020/066919.

Once electrical energy storage pack replacement is performed, a load sharing factor a indicative of a load distribution between the electrical energy storage packs of the new configuration is determined by the control unit 101 in step S116. The load sharing factor indicates how well balanced the new electrical energy storage system is. If the load sharing factor fulfils a predetermined condition, a reconfiguration of the electrical energy storage pack is performed in step S118 to more equally distribute the load across the electrical energy storage packs.

The computation of the load sharing factor needs active usage of the electrical energy storage system, i.e., some power flow out of electrical energy storage system. A load sharing factor may be computed after some trial run of a vehicle i.e., after a model-based reconfiguration and replacement decision, e.g., a workshop technician may perform a short vehicle test under varying driving style where a varying power should flow into and out of the electrical energy storage system. At the end of this test, the load sharing factor may be automatically computed by a control unit and green or red signal will be given to a technician to indicate validation of new configuration. This signal can be given either in the instrument cluster or can be read via OBD port after the test.

The load sharing factor will be continuously computed by a control unit even during normal operation of a vehicle and thus it can also be used for diagnostics i.e., it can be used to indicate when it is time to make battery pack replacement.

Figure 2D:
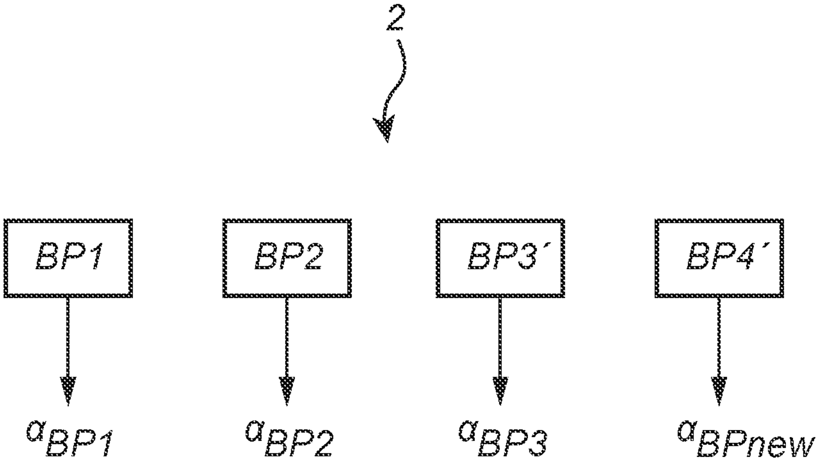
FIG. 2D is an example set of electrical energy storage packs according to example embodiments of the invention.

As indicated in FIG. 2D, a load sharing factor a is determined for all battery packs BP1, BP2, BP3', and BP4' of the new configuration.

Preferably, that the load sharing factor a fulfils a predetermined conditions includes that the load sharing factor is within a predetermined interval. Thus, when the load sharing factor is determined to be within the predetermined interval, the control unit 101 can conclude that the electrical energy storage pack replacement is completed. Thus, the vehicle can initiate operation using the energy storage system now including battery packs BP1, BP2, BP3', and BP4'.

However, when the control unit 101 concludes that the load sharing factor is outside the predetermined threshold, the step S110 of modelling with a further distribution of new electrical energy storage packs and prior electrical energy storage packs, and the step S112 of determining a load sharing factor and performing S114 a reconfiguration, are repeated with a new configuration of battery packs.

The load sharing factor provides an indication of how the total load of the electrical energy storage system is shared between the battery packs BP1-BP4'. The load sharing factor is determined for each battery pack and for a well-functioning combination of battery packs, the load sharing factor should be similar for each of the battery packs of the new configuration.

The load sharing factor may be a ratio between the average discharge/charge current for all electrical energy storage packs of the electrical energy storage system 2 when exposed to a load and a measured discharge/charge current from the respective electrical energy storage pack. More precisely, the load sharing factor (α) for an electrical energy storage pack may be given by:

$$\alpha_i(k) = \frac{\bar{I}(k)}{I_i(k)}$$

where $$\bar{I}(k) = \frac{1}{n}\sum_{1}^{n} I_i(k)$$

is the average electrical current (I) of the battery pack i.

For determining that the load sharing factor $\alpha_k$ for battery pack k fulfils a predetermined condition, the load sharing factor a k may be compared to a power ability factor $\beta_k$ given by a ratio between maximum discharge/charge current $$\left(I_{i,Ch}^{max}(k) \text{ and } I_{i,Dch}^{max}(k)\right)$$

from an electrical energy storage pack and the maximum average discharge/charge current $$\left(\bar{I}_{Ch}^{max}(k) \text{ and } \bar{I}_{Dch}^{max}(k)\right)$$

for all electrical energy storage packs of the battery.

A power ability factor/ratio for a charge current for each battery pack, i, is defined by:

$$\beta_{i,Ch}(k) = \frac{\bar{I}_{Ch}^{max}(k)}{I_{i,Ch}^{max}(k)}$$

Where $$\bar{I}_{Ch}^{max}$$

is mean/average of maximum charge abilities of all battery packs and $$I_{i,Ch}^{max}$$

is the maximum charge ability of pack i.

A power ability factor/ratio for a discharge current for each battery pack, i, is defined by:

$$\beta_{i,Dch}(k) = \frac{\bar{I}_{Dch}^{max}(k)}{I_{i,Dch}^{max}(k)}$$

Where $$\bar{I}_{Dch}^{max}$$

is the mean/average of maximum discharge abilities of all battery packs, and $$I_{i,Dch}^{max}$$

is the maximum discharge ability of battery pack i.

Ideally, for an electrical energy storage pack:

$$a_i = \beta_i$$

Which means that each battery pack is sharing power according to its ability.

However, an acceptable load-sharing-factor is within an allowed interval given by:

$$|\alpha_i - \beta_i| \leq \delta$$

Where δ is determined from or defined based on a desired power buffer. For example, if total installed electrical energy storage system power is higher than the required power then some imbalance may be allowed as the power and energy requirements may still be met. In short, this delta, δ, is defined based on how much buffer/margin in power that is desirable. Thus, the load sharing factor should not deviate by more than the threshold from the power ability factor to indicate an allowable electrical energy storage pack configuration.

A not acceptable load sharing factor is much lower or much higher than power ability factor i.e., $$\alpha_i \ll \beta_i \text{ or } \alpha_i \gg \beta_i$$

Generally, any load sharing factor which leads to a battery pack power below the required level is considered too low. On the other hand, if one battery pack has too high load sharing factor then some other battery pack has too low load sharing factor and vice versa.

Average battery utilization can be calculated for n battery packs as $$\frac{I_{ESS,Ch}^{max}}{I_{ESS}} \cdot \frac{1}{n} \cdot \sum_{j=1}^{n} \frac{i_j}{i_{j,Ch}^{max}},$$

where $$\frac{I_{ESS,Ch}^{max}}{I_{ESS}}$$

is a scaling factor. The battery utilization should ideally be equal to 1 which would indicate a perfectly balanced electrical energy storage system 2, but this will only be the case in a perfectly homogeneous electrical energy storage system. Deviations from perfect utilization is originated by heterogeneities between the electrical energy storage packs. A classifier for determining if the x:th electrical energy storage pack is suitable for an electrical energy storage system can be to compare the absolute difference between average battery utilization and utilization of this electrical energy storage pack to a threshold Δ, i.e.

$$\frac{I_{ESS,Ch}^{max}}{I_{ESS}} \cdot \left| \frac{1}{n} \cdot \sum_{j=1}^{n} \frac{i_j}{i_{j,Ch}^{max}} - \frac{i_x}{i_{j,Ch}^{max}} \right| \leq \Delta.$$

A large value is indicating that the x:th electrical energy storage pack is either taking too much, or too little, of the total load compared to its ability.

As indicated in FIG. 2, the method may include optional steps S101*a* and S101*b*. In step S101*a*, the control unit 101 classifies a vehicle usage type using vehicle driving pattern data of the vehicle as input data.

Preferably, the drive pattern data includes at least one of: average current flow through each of the electrical energy storage packs BP1-BP4, peak power points for the electrical energy storage packs BP1-BP4, and duration of the power peaks, and a statistical distribution of power between the battery packs BP1-BP4 for a specific vehicle usage type.

The data from the sensors 202*a-b* are logged on-board and are preferably transmitted to a remote server 102, i.e., to the cloud for storage. However, it would be possible to store the data from the sensors 202*a-b* in an on-board data memory storage 204. Further, the memory storage 204 may also store a power and energy requirement model associating classified vehicle usage types with minimum state of health requirements, as will be discussed in more detail herein.

The control unit 101 is configured to acquire the vehicle driving pattern data from the cloud-based server 102, or optionally form the memory storage 204 of the vehicle 1, and to classify a vehicle usage type using a classification model 211 and the vehicle driving pattern data.

In step S101*b*, the control unit 101 determines the energy and power requirements according to the classified vehicle usage type. Thus, depending on the type of vehicle use or application or typical mission, different energy and power requirements apply.

Further, the minimum state of health required for usage according to the classified vehicle usage type may be determined from relating the determined the energy and power requirements to a minimum state of health. Each vehicle usage type is based on modelled power and energy requirements for the associated vehicle usage type. Thus, the control unit, which has access to the model 212 via the memory storage 204, is configured to determine, using the power and energy requirement model 212, a minimum state of health required for the vehicle usage according to the classified vehicle usage type. The output from the classification model 211 is used as input to the power and energy requirement model 212.

The power and energy requirement model 212 generally relates a minimum level of performance required in terms of power, energy, and range for the vehicle provided its intended use, assignments, or mission, to a minimum state of health of the battery packs BP1-BP4. The minimum state of health is a threshold below which power and/or range requirements can no longer be meet. This requirement model 212 may be based on a multi-battery model which takes vehicle performance requirements such as power, energy, and range requirements as input and then output whether these requirements can be met without violating limits of each battery pack in the energy storage system. If a limit of any battery pack is violated, it is concluded that at least one of the battery packs does not have sufficient state of health level. It is also envisaged that the model 212 may for example be a look-up table relating vehicle usage type to energy and power requirements and minimum state of health.

Figure 5:
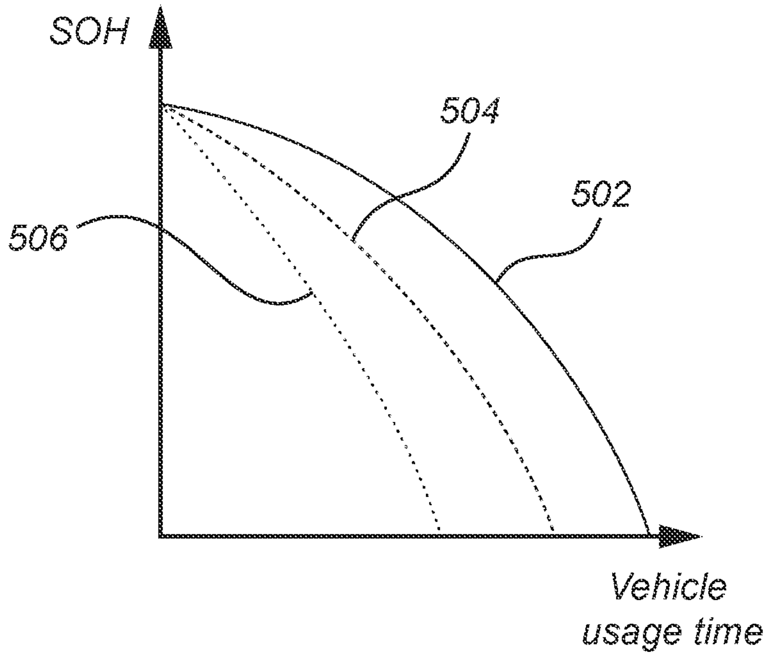
FIG. 5 illustrates conceptual state of health curves.

FIG. 5 conceptually illustrates the state of health, SOH, as a function of vehicle usage in terms of vehicle usage time. Generally, a mild usage deteriorates the state of health slower than a harsh usage. In FIG. 5, the curve 502 indicates a mild or benign usage, which deteriorates the battery pack state of health slower than a moderate or medium usage indicated by curve 504, or a harsh or aggressive use indicated by curve 506. Provided a minimum level of energy or range, if the vehicle usage is classified as harsh, the minimum state of health must be higher than if the vehicle usage is classified as mild 502 or moderate 504.

Preferably, the combination of added new or recycled electrical energy storage packs, BP3' and BP4', and prior electrical energy storage packs BP1 and BP2 is determined depending on the classified vehicle usage type and the associated minimum state of health. The distribution is determined so that the electrical energy storage system 2 can achieve the minimum performance requirement for the vehicle. The combination of new electrical energy storage packs and maintained electrical energy storage packs are modelled to estimate energy and power de-rating after reconfiguration to determine load distribution between electrical energy storage packs after reconfiguration. The electrical energy storage packs are reconfigured based on the outcome of the modelling step.

The method described herein may be performed as an on-board application of the vehicle 1. Further, the method may comprise continuously monitoring the state of health of the electrical energy storage packs BP1-BP4 to evaluate whether a replacement is needed, and if a replacement of an electrical energy storage is conclusive, provide a signal indicative thereof to a user. This provides for an autonomous decision proves for deciding when an electrical energy storage pack replacement is needed. The signal may be provided as an indication to an application running on a portable device or to a dashboard of the vehicle 1. The signal may be generated by the control unit 101.

A control unit may include a microprocessor, microcontroller, programmable digital signal processor or another programmable device. Thus, the control unit comprises electronic circuits and connections (not shown) as well as processing circuitry (not shown) such that the control unit can communicate with different parts of the truck such as the brakes, suspension, driveline, in particular an electrical engine, an electric machine, a clutch, and a gearbox in order to at least partly operate the truck. The control unit may comprise modules in either hardware or software, or partially in hardware or software and communicate using known transmission buses such as CAN-bus and/or wireless communication capabilities. The processing circuitry may be a general purpose processor or a specific processor. The control unit comprises a non-transitory memory for storing computer program code and data upon. Thus, the skilled addressee realizes that the control unit may be embodied by many different constructions.

The control functionality of the present disclosure may be implemented using existing computer processors, or by a special purpose computer processor for an appropriate system, incorporated for this or another purpose, or by a hardwire system. Embodiments within the scope of the present disclosure include program products comprising machine-readable medium for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures, and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium.

Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a sequence the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps. Additionally, even though the invention has been described with reference to specific exemplifying embodiments thereof, many different alterations, modifications and the like will become apparent for those skilled in the art.

It is to be understood that the present invention is not limited to the embodiments described above and illustrated in the drawings; rather, the skilled person will recognize that many changes and modifications may be made within the scope of the appended claims.

The invention claimed is:

1. A method for reconfiguring electrical energy storage packs of an electrical energy storage system of a vehicle, the method comprising:

determining a state of health of each of the electrical energy storage packs of the vehicle;

detecting at least one malfunctioning electrical energy storage pack of the electrical energy storage system;

determining an uncertainty measure for each of the determined state of health's;

concluding to replace the electrical energy storage packs having state of health lower than a minimum state of health, and electrical energy storage packs that are concluded to be malfunctioning, evaluating the determined state of health's and the corresponding uncertainties for maintained electrical energy storage packs and a set of replacement electrical energy storage packs to find a combination of maintained electrical energy storage packs and replacement electrical energy storage packs that fulfil energy and power requirements for the vehicle taking the uncertainties in state of health into account;

determining a new configuration of the electrical energy storage system including the combination of maintained electrical energy storage packs and replacement electrical energy storage packs, providing a signal indicating an arrangement of the electrical energy storage packs according to the new configuration, once electrical energy storage pack replacement is performed, determining a load sharing factor indicative of a load distribution between the electrical energy storage packs of the new configuration, and if the load sharing factor fulfils a predetermined condition, performing a reconfiguration of the electrical energy storage pack to more equally distribute the load across the electrical energy storage packs.

2. The method according to claim 1, wherein finding a combination of maintained electrical energy storage packs and replacement electrical energy storage packs comprises inserting the determined state of health's and corresponding uncertainties of the electrical energy storage packs in a decision matrix to determine further electrical energy storage packs to replace.

3. The method according to claim 1, wherein that the load sharing factor fulfils a predetermined condition includes that the load sharing factor is within a predetermined interval, wherein when the load sharing factor is concluded to be within the predetermined interval, concluding that the electrical energy storage pack replacement is completed.

4. The method according to claim 1, wherein the load sharing factor is a ratio between a measured discharge/charge current from an electrical energy storage pack and the average discharge/charge current for all electrical energy storage packs of the battery when exposed to a load.

5. The method according to claim 1, wherein for determining the that load sharing factor fulfils a predetermined condition, the load sharing factor is compared to a power ability factor given by a ratio between maximum discharge/charge current from an electrical energy storage pack and the maximum average discharge/charge current for all electrical energy storage packs of the battery.

6. The method according to claim 5, wherein the load sharing factor should not deviate by more than a threshold from the power ability factor to indicate an allowable electrical energy storage pack configuration.

7. The method according to claim 1, where the uncertainty for each of the determined state of health's is determined from uncertainties in electrical measurements performed for measuring an electrical energy storage pack parameter used for estimating the state of health.

8. The method according to claim 1, comprising:

classifying a vehicle usage type using vehicle driving pattern data of the vehicle as input data; and determining the energy and power requirements according to the classified vehicle usage type.

9. The method according to claim 1, comprising:

retrieving data indicating a set of available replacement electrical energy storage packs, their state of health's and uncertainties, and using the data in the evaluation step.

10. The method according to claim 1, wherein the step of evaluating comprises:

modelling the power and energy available for the combination of maintained electrical energy storage packs and replacement electrical energy storage packs;

modelling the combination of maintained electrical energy storage packs and replacement electrical energy storage packs to determine load distribution between electrical energy storage packs after reconfiguration.

11. A non-transitory computer readable medium carrying a computer program comprising program code for performing the steps of claim 1 when said program product code is run on a computer.

12. A control unit for determining an electrical energy storage pack for reconfiguring electrical energy storage packs of an electrical energy storage system of a vehicle, the control unit is configured to perform the steps of the method according to claim 1.

13. A system for reconfiguring electrical energy storage packs of an electrical energy storage system of a vehicle, comprising:

sensors for collecting driving pattern data indicative of the use pattern of the vehicle and for collecting electrical energy storage sensor data, and a control unit configured to:

determine a state of health of each of the electrical energy storage packs of the vehicle from the sensor data;

detect at least one malfunctioning electrical energy storage pack of the battery by evaluating the sensor data;

determine an uncertainty measure for each of the determined state of health's based on uncertainties in the sensor data;

conclude to replace the electrical energy storage packs having state of health lower than a minimum state of health, and electrical energy storage packs that are concluded to be malfunctioning, evaluate the determined state of health's and the corresponding uncertainties for maintained electrical energy storage packs and a set of replacement electrical energy storage packs to find a combination of maintained electrical energy storage packs and replacement electrical energy storage packs that fulfil energy and power requirements for the vehicle taking the uncertainties in state of health into account;

determine a new configuration of the electrical energy storage system including the combination of maintained electrical energy storage packs and replacement electrical energy storage packs, provide a signal indicating an arrangement of the electrical energy storage packs according to the new configuration, once electrical energy storage pack replacement is performed, determine a load sharing factor indicative of a load distribution between the electrical energy storage packs of the new configuration, and if the load sharing factor fulfils a predetermined condition, perform a reconfiguration of the electrical energy storage pack to more equally distribute the load across the electrical energy storage packs and provide a signal indicative of an updated arrangement of electrical energy storage packs.

14. A vehicle comprising a system according to claim 13.

* * * * *